(12) United States Patent
Beesley et al.

(10) Patent No.: US 6,650,996 B1
(45) Date of Patent: Nov. 18, 2003

(54) SYSTEM AND METHOD FOR COMPRESSING DATA

(75) Inventors: Darin J. Beesley, Overland Park, KS (US); Stephen C. Robinson, Olathe, KS (US); Michael Childs, Olathe, KS (US); Chunyen Liu, Overland Park, KS (US)

(73) Assignee: Garmin Ltd. (KY)

( * ) Notice: Subject to any disclaimer, the term of this patent is extended or adjusted under 35 U.S.C. 154(b) by 12 days.

(21) Appl. No.: 10/027,334

(22) Filed: Dec. 20, 2001

(51) Int. Cl.$^7$ .......................... H03M 7/40; G01C 21/00
(52) U.S. Cl. ............................ 701/200; 341/65; 341/67
(58) Field of Search ..................... 701/200; 382/246; 707/101, 104; 341/65, 67

(56) References Cited

U.S. PATENT DOCUMENTS

| | | | | |
|---|---|---|---|---|
| 3,883,847 | A | * 5/1975 | Frank | 711/206 |
| 5,208,593 | A | * 5/1993 | Tong et al. | 341/65 |
| 5,821,887 | A | * 10/1998 | Zhu | 341/67 |
| 6,021,406 | A | 2/2000 | Kuznetsov | 707/6 |
| 6,047,280 | A | * 4/2000 | Ashby et al. | 707/2 |
| 6,219,457 | B1 | * 4/2001 | Potu | 382/246 |
| 6,317,684 | B1 | 11/2001 | Roeseler et al. | 701/202 |
| 6,317,687 | B1 | 11/2001 | Morimoto et al. | 701/211 |
| 6,321,158 | B1 | 11/2001 | DeLorme et al. | 701/201 |
| 6,393,149 | B2 | * 5/2002 | Friederich et al. | 382/173 |
| 6,504,496 | B1 | * 1/2003 | Mesarovic et al. | 341/106 |
| 6,563,440 | B1 | * 5/2003 | Kangas | 341/65 |
| 2003/0006918 | A1 | * 1/2003 | Barnett | 341/67 |

OTHER PUBLICATIONS

Nekritch, Y.; Byte–oriented decoding of canonical Huffman codes; IEEE–Information Theory 2000; Jun. 2000; p. 371.*
Chung et al.; Level–Compressed Huffman Decoding; IEEE–Transactions on Communication; Oct. 1999; vol. 47, No. 10; pp. 1455–1457.*

"An optimal pathfinder for vehicles in real–world digital terrain maps", http://www.nease.net/jamsoft/shortestpath/pathfinder/4.html, 11 pages, (1999).

"Informed Search Methods", *Artificial Intelligence, A Modern Approach*, Prentice Hall, Inc., pp. 92–115, (1995).

"Real–Time Vehicle Routing in Dynamic and Stochastic Urban Traffic Networks", http://www.gpu.srv.ualberta.ca/lfu/research.htm, pp. 1–3, (1997).

Ahuja, R., et al., "Faster Algorithms for the Shortest Path Problem", *Journal of the Association for Computing Machinery*, 37(2), pp. 213–223, (1990).

Chung, V., et al. "An Efficient Implementation of Parallel A *", *CFPAR*, Montreal, Canada, pp. 153–167, (1994).

Fredman, M., et al., "Fibonacci heaps and their uses in improved network optimization algorithms", *Journal of the ACM*, 34(3), 2 pages, (1987).

(List continued on next page.)

*Primary Examiner*—Michael J. Zanelli
(74) *Attorney, Agent, or Firm*—Devon A. Rolf

(57) ABSTRACT

Systems, devices and methods are provided to compress data, and in particular to code and decode data. One aspect of the present subject matter is a data structure. The data structure includes a field representing a decoding structure to decode canonical Huffman encoded data, and a field representing a symbol table. The decoding structure includes a field representing an accelerator table to provide a $2^N$-deep direct-index lookup to provide high-frequency symbols for high-frequency data and to provide bracketing indices for low-frequency data. The decoding structure also includes a field for a binary search table to provide a low-frequency symbol index using a binary search bounded by the bracketing indices provided by the accelerator table. The symbol table is adapted to provide a symbol associated with the low-frequency index.

33 Claims, 16 Drawing Sheets

OTHER PUBLICATIONS

Fu, L., "Heuristic Shortest Path Algorithms and their Potential IVHS Applications", *Proceedings of the Fourth University of Alberta—University of Calgary, Joint Graduate Student Symposium in Transportation Engineering,* pp. 83–109, (1995).

Ikeda, T., et al., "A Fast Algorithm for Finding Better Routes by AI Search Techniques", *Vehicle Navigation and Information Systems Conference Proceedings,* pp. 291–296, (1994).

Kaindl, H., et al., "Memory–Bounded Bidirectional Search", *Proceedings of the 12th National Conference on Art,* AAAI press, Seattle, WA, pp. 1359–1364, (1994).

Laporte, G., "The Vehicle Routing Problem: An overview of exact and approximate algorithms", *European Journal of Operational Research,* 59, pp. 345–358, (1992).

Myers, B., "Data Structures for Best–First Search", http://www4.ncsu.edu/jbmyers/dsai.htm, pp. 1–6, (1997).

Ronngren, R., et al., "Parallel and Sequential Priority Queue Algorithms", *ACM Transactions on Modeling and Computer Simulation,* 7 (2), pp. 168–172, 198, 199, (1997).

Stout, B., "Smart Moves: Intelligent Pathfinding", *Gamasutra,* http://www.gamasutra.com/features/programming/080197/pathfinding.htm, pp. 1–11, (1997).

Wai, L., et al., "Comparative Study of Shortest Path Algorithm for Transport Network", *USRP Report 2,* http://www.comp.nus.edu.sg/, leonghoe/USRPreport–txt.html, pp. 1–10, (1999).

Zhan, F.B., "Three Fastest Shortest Path Algorithms on Real Road Networks: Data Structures and Procedures", *Journal of Geographic Information and Decision Analysis,* 1 (1), http://www.geog.uwo.ca/gimda/journal/vol1.1/Zhan/Zhan.htm, 11 pages, (1997).

Zhao, Y., et al., "An Adaptive Route–Guidance Algorithm for Intelligent Vehicle Highway Systems", *American Control Conference, Boston, MA,* Department of Electrical Engineering and Computer Science, The University of Michigan, pp. 2568–2573, (1991).

* cited by examiner

| ASSIGNED CANONICAL HUFFMAN CODE | | | | | | | | | | | | | | | | BIT LENGTH | SYMBOL | SYMBOL INDEX |
|---|---|---|---|---|---|---|---|---|---|---|---|---|---|---|---|---|---|---|
| MSB | | | | | | | | | | | | | | | LSB | | | |
| 0 0 0 0 | 0 | 0 | 0 | 0 | 0 | 0 | 0 | 0 | 0 | 0 | 0 | 0 | 0 | 0 | 0 | 16 | 0x01 | 0 |
| 0 0 0 0 | 0 | 0 | 0 | 0 | 0 | 0 | 0 | 0 | 0 | 0 | 0 | 0 | 0 | 0 | 1 | | 0x1D | 1 |
| 0 0 0 0 | 0 | 0 | 0 | 0 | 0 | 0 | 0 | 0 | 0 | 0 | 0 | 0 | 0 | 1 | 0 | | ',' | 2 |
| 0 0 0 0 | 0 | 0 | 0 | 0 | 0 | 0 | 0 | 0 | 0 | 0 | 0 | 0 | 0 | 1 | 1 | | '.' | 3 |
| 0 0 0 0 | 0 | 0 | 0 | 0 | 0 | 0 | 0 | 0 | 0 | 0 | 0 | 1 | | | | 14 | 0x02 | 4 |
| 0 0 0 0 | 0 | 0 | 0 | 0 | 0 | 0 | 0 | 0 | 0 | 0 | 1 | | | | | 13 | '/' | 5 |
| 0 0 0 0 | 0 | 0 | 0 | 0 | 0 | 0 | 0 | 0 | 0 | 1 | | | | | | 12 | 0x03 | 6 |
| 0 0 0 0 | 0 | 0 | 0 | 0 | 0 | 0 | 0 | 0 | 1 | | | | | | | 11 | '-' | 7 |
| 0 0 0 0 | 0 | 0 | 0 | 0 | 0 | 0 | 0 | 1 | 0 | | | | | | | | 'Q' | 8 |
| 0 0 0 0 | 0 | 0 | 0 | 0 | 0 | 0 | 0 | 1 | 1 | | | | | | | | 'X' | 9 |
| 0 0 0 0 | 0 | 0 | 0 | 0 | 0 | 0 | 1 | 0 | | | | | | | | 10 | '&' | 10 |
| 0 0 0 0 | 0 | 0 | 0 | 0 | 0 | 0 | 1 | 1 | | | | | | | | | 'Z' | 11 |
| 0 0 0 0 | 0 | 0 | 0 | 0 | 0 | 1 | 0 | | | | | | | | | 9 | '"' | 12 |
| 0 0 0 0 | 0 | 0 | 0 | 0 | 0 | 1 | 1 | | | | | | | | | | 'J' | 13 |

| Assigned Canonical Huffman Code (MSB → LSB) | Bit Length | Symbol | Symbol Index |
|---|---|---|---|
| 00000000 | 8 | '0' | 14 |
| 00000001 |  | '3' | 15 |
| 00000010 |  | '4' | 16 |
| 00000011 |  | '7' | 17 |
| 00000100 |  | '8' | 18 |
| 00000101 |  | '9' | 19 |
| 0000011 0 | 7 | '1' | 20 |
| 0000011 1 |  | '2' | 21 |
| 0000100 0 |  | '5' | 22 |
| 0000100 1 |  | '6' | 23 |
| 0000101 0 |  | 'F' | 24 |
| 0000101 1 |  | 'Y' | 25 |
| 000011 00 | 6 | 0x20 | 26 |
| 000011 01 |  | 'B' | 27 |
| 000011 10 |  | 'C' | 28 |
| 000011 11 |  | 'H' | 29 |
| 000100 00 |  | 'M' | 30 |
| 000100 01 |  | 'P' | 31 |
| 000100 10 |  | 'U' | 32 |
| 000100 11 |  | 'V' | 33 |
| 000101 00 |  | 'W' | 34 |

| Assigned Canonical Huffman Code (MSB → LSB) | Bit Length | Symbol | Symbol Index |
|---|---|---|---|
| 0 0 1 1 1 | 5 | 0x1B | 35 |
| 0 1 0 0 0 | | 'C' | 36 |
| 0 1 0 0 1 | | 'I' | 37 |
| 0 1 0 1 0 | | 'K' | 38 |
| 0 1 0 1 1 | | 'S' | 39 |
| 0 1 1 0 | 4 | 0x1C | 40 |
| 0 1 1 1 | | 'A' | 41 |
| 1 0 0 0 | | 'D' | 42 |
| 1 0 0 1 | | 'E' | 43 |
| 1 0 1 0 | | 'L' | 44 |
| 1 0 1 1 | | 'N' | 45 |
| 1 1 0 0 | | 'O' | 46 |
| 1 1 0 1 | | 'R' | 47 |
| 1 1 1 0 | | 'T' | 48 |
| 1 1 1 1 | | 0x00 | 49 |

| TABLE INDEX | COMPARE VALUE | BITS USED | SYMBOL BASE INDEX |
|---|---|---|---|
| 0 | 0000000000000000 | 16 | 0 |
| 1 | 00000100000000000 | 14 | 4 |
| 2 | 000001000000000 | 13 | 5 |
| 3 | 00000100000000 | 12 | 6 |
| 4 | 0000010000000 | 11 | 7 |
| 5 | 000001000000 | 10 | 10 |
| 6 | 00000100000 | 9 | 12 |
| 7 | 0000010000 | 8 | 14 |
| 8 | 000001000 | 7 | 20 |
| 9 | 00000100 | 6 | 26 |
| 10 | 0000010 | 5 | 35 |
| 11 | 000000 | 4 | 40 |

FIG. 12

| TABLE INDEX | # BITS USED | SYMBOL | SEARCH TABLE START INDEX | SEARCH TABLE END INDEX |
|---|---|---|---|---|
| 00000 | 5 | | 0 | 7 |
| 00001 | 5 | | 8 | 8 |
| 00010 | 5 | | 8 | 9 |
| 00011 | 5 | | 9 | 9 |
| 00100 | 5 | | 9 | 9 |
| 00101 | 5 | | 9 | 9 |
| 00110 | 5 | | 9 | 9 |
| 00111 | 5 | 0x1B | | |
| 01000 | 5 | 'C' | | |
| 01001 | 5 | 'I' | | |
| 01010 | 5 | 'K' | | |
| 01011 | 5 | 'S' | | |
| 01100 | 4 | 0x1C | | |
| 01101 | 4 | 0x1C | | |
| 01110 | 4 | 'A' | | |
| 01111 | 4 | 'A' | | |
| 10000 | 4 | 'D' | | |
| 10001 | 4 | 'D' | | |
| 10010 | 4 | 'E' | | |
| 10011 | 4 | 'E' | | |
| 10100 | 4 | 'L' | | |
| 10101 | 4 | 'L' | | |
| 10110 | 4 | 'N' | | |
| 10111 | 4 | 'N' | | |
| 11000 | 4 | 'O' | | |
| 11001 | 4 | 'O' | | |
| 11010 | 4 | 'R' | | |
| 11011 | 4 | 'R' | | |
| 11100 | 4 | 'T' | | |
| 11101 | 4 | 'T' | | |
| 11110 | 4 | 0x0 | | |
| 11111 | 4 | 0x0 | | |

FIG. 13

SYSTEM AND METHOD FOR COMPRESSING DATA

FIELD OF THE INVENTION

The present invention relates generally to data compression, and in particular to systems and methods for compressing text and data for navigational devices.

BACKGROUND OF THE INVENTION

Navigational devices are well known. The capabilities of navigational devices and methods depend on system resources, such as processor speed and the amount and speed of memory. The processes implemented by a navigation device are a function of overall system cost because an increase in system capability also increases system cost. The known art includes a spectrum of products in which the degree of navigational accuracy is dictated primarily by the cost of the system. The lower cost systems currently offer a lower degree of accuracy that often is inadequate for most users. Other devices also depend on system resources, such as processor speed and the amount and speed of memory.

The known art compresses data, including text, in an attempt to improve the efficiency of the system resources. That is, compression improves the performance of a system that has a limited processor speed and a limited amount and speed of memory. Compressing data involves encoding data, and this encoded data is decoded for an end use in a device. For example, a navigational device end use includes, but is not limited to, displaying text or other cartographic data. One conventional method for encoding and decoding data, particularly text data, involves Huffman codes or canonical Huffman codes. Huffman codes and canonical Huffman codes will be described in more detail below.

Decoding the encoded data often involves a time-space tradeoff. Increasing the allocated space for a decoding structure typically increases the speed of the decoding operation; whereas decreasing the allocated space for a decoding structure often decreases the speed of the decoding operation. In certain applications, it is desired to balance the competing needs of decoding speed and memory space so that an adequate decoding speed is achieved using an acceptable amount of memory. For example, in certain applications, it may be desired to reduce the memory space taken up by the decoding structure at the expense of an acceptable slowing of the decoding speed. In other applications, it may be desired to increase the speed of the decoding operation at the expense of an acceptable amount of additional memory space taken up by the decoding structure.

Therefore, there exists a need for a data compression system and method which provides design flexibility by allowing design choices to be made to increase decoding speed by adding more space to the decoding structure or to decrease the decoding structure space and decrease the decoding speed.

SUMMARY OF THE INVENTION

The above mentioned problems of navigational devices are addressed by the present invention and will be understood by reading and studying the following specification. Systems and methods are provided to compress data, and in particular to code and decode data using canonical Huffman codes. These systems and methods are incorporated into navigational devices in one embodiment. However, the invention is not so limited.

An acceleration table is provided to extract high-frequency data using a direct index lookup and bracketing indices to provide bounds for a secondary search. In one embodiment, the secondary search is a binary search. A binary search table is provided to extract base canonical Huffman codes for each bit length of the encoded data, from which low-frequency data indices are derived to extract low-frequency data. Thus, the present invention provides design flexibility by allowing choices to be made with respect to balancing the competing needs of space and speed by, for example, increasing decoding speed by adding more space to the acceleration table in the decoding structure or decreasing the decoding structure space to conserve memory space at the expense of decreasing the decoding speed by an acceptable amount. A faster decoding speed allows a navigation device that has a limited processor and memory speed to provide more navigation data to a user in a timely manner. A smaller decoding structure allows more memory in a limited memory navigation device to be allocated for other purposes.

One aspect provides a data structure stored on a computer readable medium. According to one embodiment, the data structure includes a field representing a decoding structure to decode canonical Huffman encoded data, and a field representing a symbol table. The decoding structure includes a field representing an accelerator table to receive N bits from the encoded data to perform a $2^N$-deep direct-index lookup to provide a high-frequency symbol index for high-frequency data and to provide bracketing indices for low-frequency data. The decoding structure also includes a field representing a binary search table to provide a low-frequency symbol index using a binary search bounded by the bracketing indices provided by the accelerator table. The symbol table is adapted to provide a high-frequency symbol associated with the high-frequency index and a low-frequency symbol associated with the low-frequency symbol index.

Other aspects provided herein include an electronic navigational device, a navigation system, and a method for decoding encoded data. These, as well as other novel aspects, embodiments, advantages, details, and features of the present invention, will be apparent to those skilled in the art from the following detailed description of the invention, the attached claims and accompanying drawings, listed herein below, which are useful in explaining the invention.

BRIEF DESCRIPTION OF THE DRAWINGS

FIGS. 11A, 11B and 11C illustrate a table containing assigned canonical Huffman codes for symbols;

FIG. 12 illustrates an example of a binary search table as shown in the data structure of FIG. 8; and FIG. 13 illustrates an example of an accelerator table as shown in the data structure of FIG. 8.

DETAILED DESCRIPTION OF THE INVENTION

A better understanding of the present invention reference may be had to the following detailed description taken in conjunction with dependant claims and accompanied drawings. In essence, the present invention allows choices to be made in the design of an electronic navigation device to increase decoding speed by adding more space to the decoding structure or to conserve memory space by decreasing the decoding structure space while only compromising decoding speed to an acceptable level.

Figure 1:
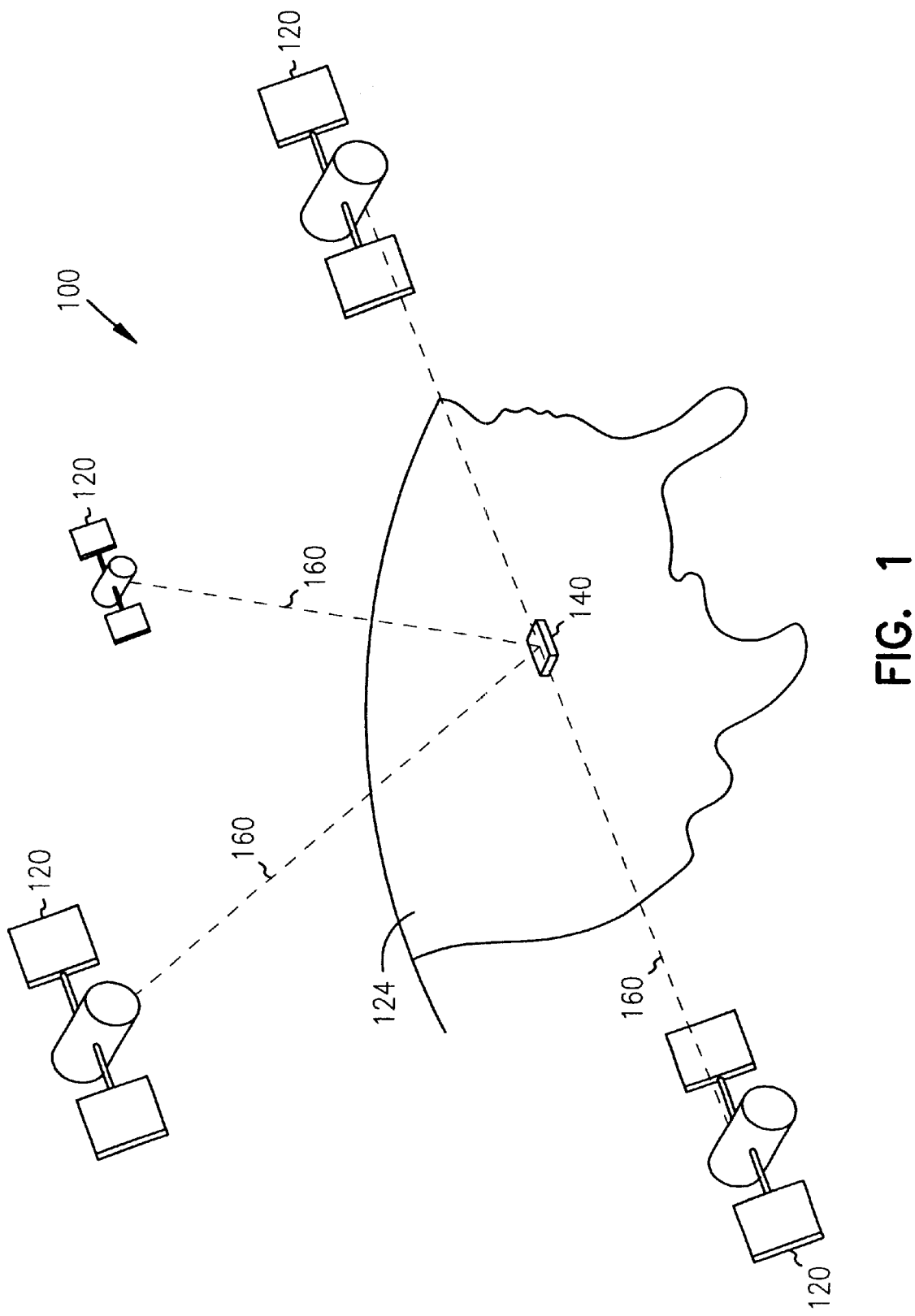
FIG. 1 is a representative of a global positioning system (GPS)

FIG. 1 is a representative of a global positioning system (GPS). The GPS 100 includes a plurality of satellites 120 and a GPS receiver device 140. The plurality of satellites 120 are in orbit about the Earth 124. The orbit of each satellite 120 is not necessarily synchronous with the orbits of other satellites 120 and, in fact, is likely asynchronous. The GPS receiver device 140 of the present invention is shown receiving spread spectrum GPS satellite signals 160 from the various satellites 120.

The spread spectrum signals 160 continuously transmitted from each satellite 120 utilize a highly accurate frequency standard accomplished with an extremely accurate atomic clock. Each satellite 120, as part of its data signal transmission 160, transmits a data stream indicative of that particular satellite 120. It will be appreciated by those skilled in the relevant art that the GPS receiver device 140 must acquire spread spectrum GPS satellite signals 160 from at least three satellites 120 for the GPS receiver device 140 to calculate its two-dimensional position by triangularization. Acquisition of an additional signal 160, resulting in signals 160 from a total of four satellites 120, permits GPS receiver device 140 to calculate its three-dimensional position.

Figure 2A:
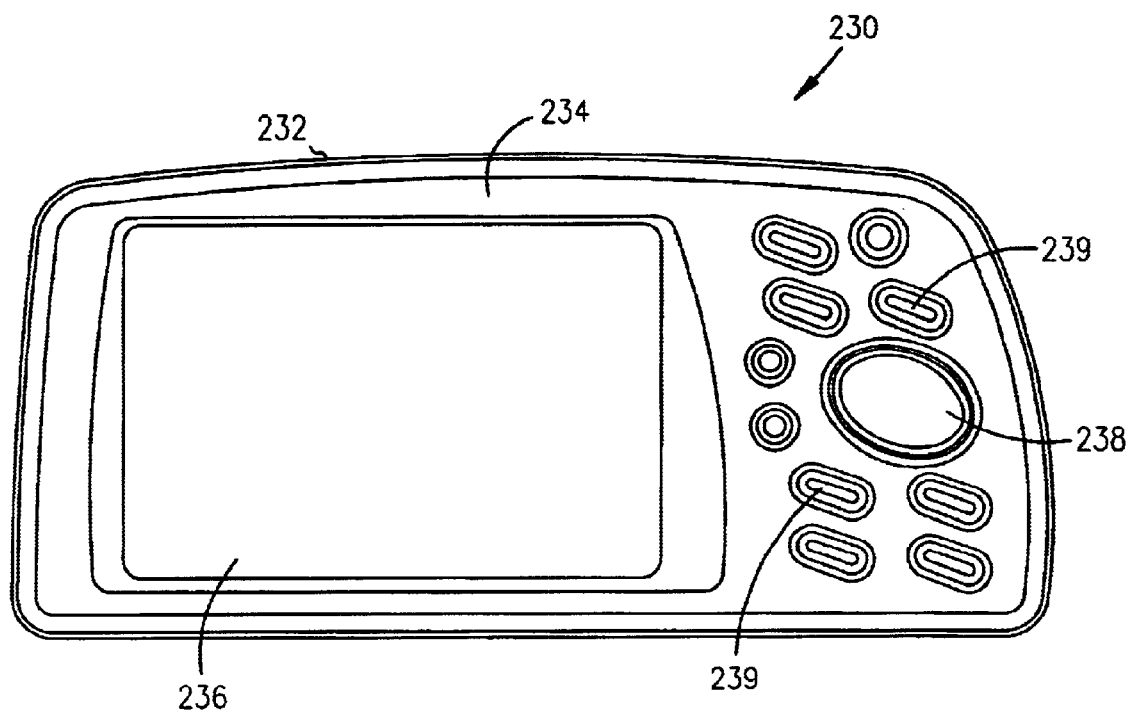
FIGS. 2A and 2B illustrate views for one embodiment of an electronic navigational device.
Figure 2B:
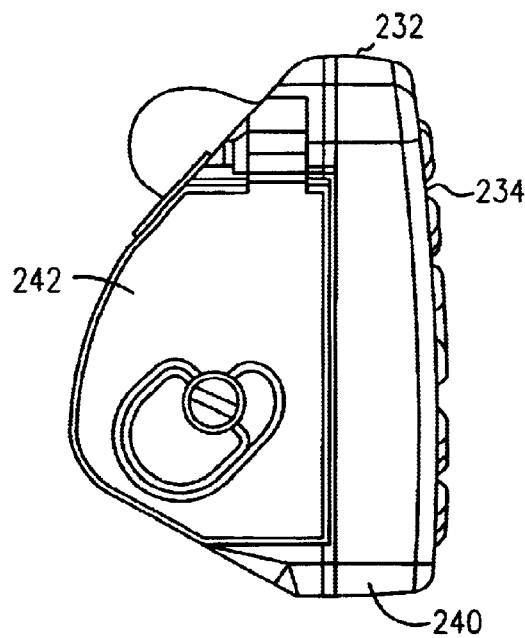

FIGS. 2A and 2B illustrate views for one embodiment of an electronic navigational device 230 according to the teachings of the present invention. As one of ordinary skill in the art will understand upon reading this disclosure, the device can be portable and can be utilized in any number of implementations such as automobile, personal marine craft, and avionic navigation. In the embodiment of FIG. 2A a front view of the navigational device 230 is provided showing the navigational device has a generally rectangular housing 232. The housing 232 is constructed of resilient material and has been rounded for aesthetic and ergonomic purposes. As shown in FIG. 2A, the control face 234 has access slots for an input key pad 238, other individual keys 239, and a display screen 236. In one embodiment, the display screen 236 is a LCD display which is capable of displaying both text and graphical information. The invention, however, is not so limited.

In FIG. 2B, a side view of the navigational device 230 is provided. FIG. 2B illustrates that the device's housing 232 is defined by an outer front case 240 and a rear case 242. As shown in FIG. 2B, the outer front case 240 is defined by the control face 234. In the embodiment shown in FIG. 2B, the outer front case 240 and the rear case 242 are made of separate molded pieces to form the device housing 232 and support input key pad 238, other individual keys 239, and display screen 236 in respective access slots shown in the control face 234 of FIG. 2A.

Figure 3A:
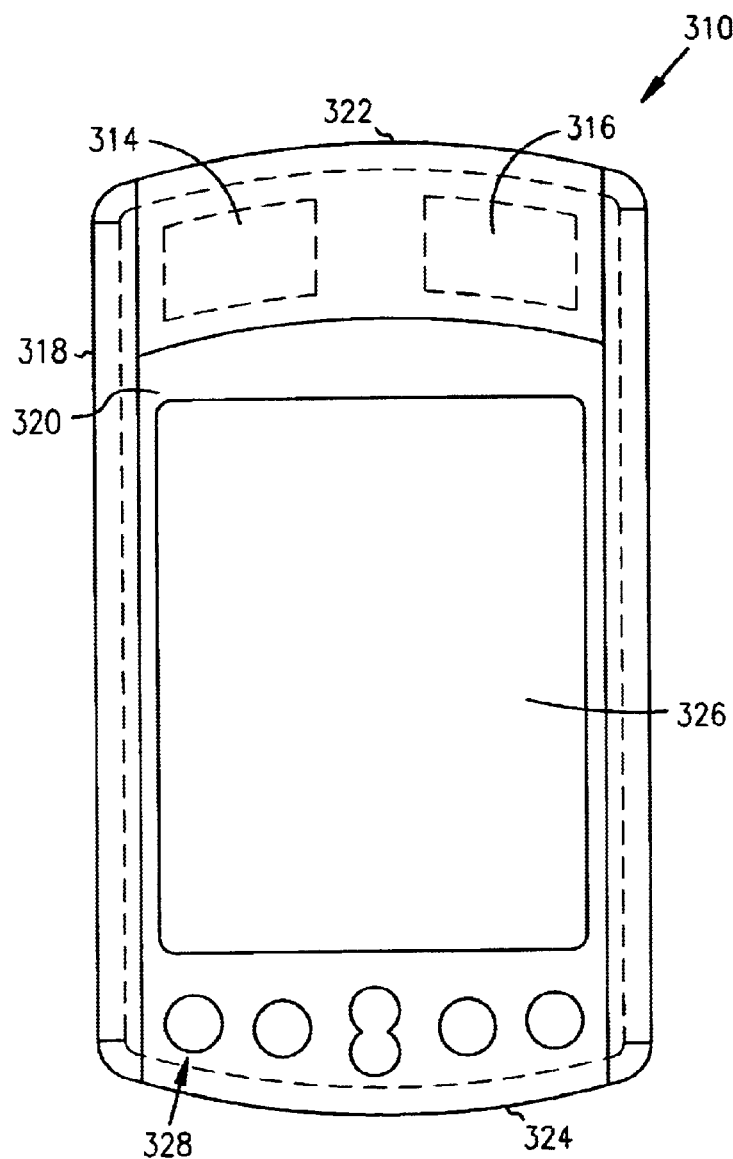
FIGS. 3A–3C illustrate views for another embodiment of an electronic navigational device.
Figure 3B:
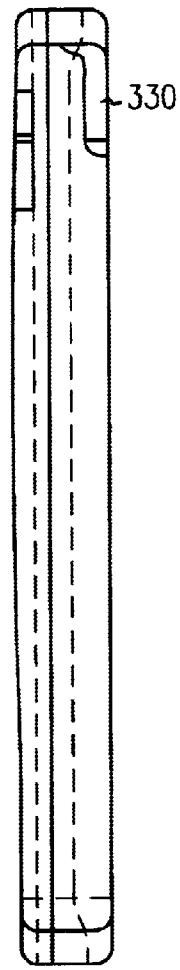
Figure 3C:
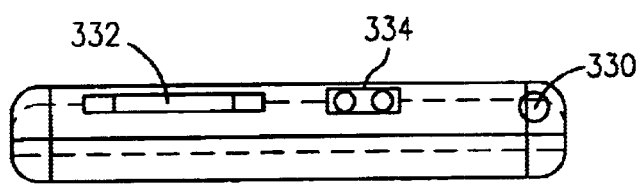

FIGS. 3A–3C illustrate views for another embodiment of an electronic navigational device 310 according to the teachings of the present invention. The navigational device 310 shown in FIGS. 3A–3C includes a personal digital assistant (PDA) with integrated GPS receiver and cellular transceiver according to the teachings of the present invention. The GPS integrated PDA operates with an operating system (OS) such as, for example, the well-known Palm or Pocket PC operating systems, or the lesser-used Linux OS. As shown in the top view of FIG. 3A, the GPS integrated PDA 310 includes an internal integrated GPS patch antenna 314 and a cellular transceiver 316 contained in a housing 318. The housing 318 is generally rectangular with a low profile and has a front face 320 extending from a top end 322 to a bottom end 324. Mounted on front face 320 is a display screen 326, which is touch sensitive and responsive to a stylus 330 (shown stored in the side view of FIG. 3B) or a finger touch. FIGS. 3A–3C illustrate the stylus 330 nested within housing 318 for storage and convenient access in a conventional manner. The embodiment shown in FIG. 3A illustrates a number of control buttons, or input keys 328 positioned toward the bottom end 324. The invention, however, is not so limited and one of ordinary skill in the art will appreciate that the input keys 328 can be positioned toward the top end 322 or at any other suitable location. The end view of FIG. 3C illustrates a map data cartridge bay slot 332 and headphone jack 334 provided at the top end 322 of the housing 318. Again, the invention is not so limited and one of ordinary skill in the art will appreciate that a map data cartridge bay slot 332 and headphone jack 334 can be provided at the bottom end 324, separately at opposite ends, or at any other suitable location.

It should be understood that the structure of GPS integrated PDA 310 is shown as illustrative of one type of integrated PDA navigation device. Other physical structures, such as a cellular telephone and a vehicle-mounted unit are contemplated within the scope of this invention.

FIGS. 2A–2B and 3A–3C are provided as illustrative examples of hardware components for a navigational device according to the teachings of the present invention. However, the invention is not limited to the configuration shown in FIGS. 2A–2B and 3A–3C. One of ordinary skill in the art will appreciate other suitable designs for a hardware device which can accommodate the present invention.

Figure 4A:
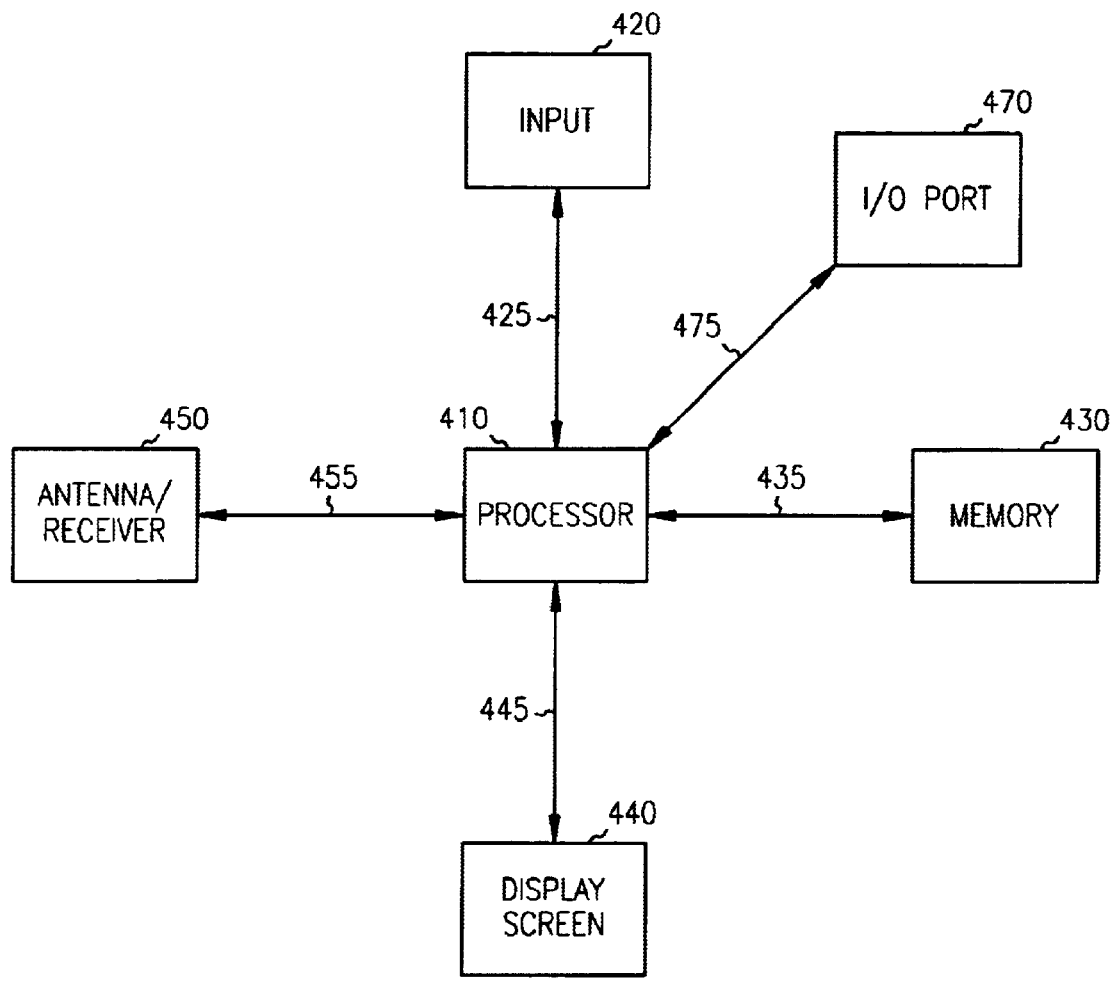
FIG. 4A is a block diagram of one embodiment for the electronic components within the hardware of FIGS. 2A–2B.

FIG. 4A is a block diagram of one embodiment for the electronic components within the hardware of FIGS. 2A–2B, such as within housing 332 and utilized by the electronic navigational device. In the embodiment shown in FIG. 4A, the electronic components include a processor 410 which is connected to an input 420, such as keypad via line 425. It will be understood that input 420 may alternatively be a microphone for receiving voice commands. Processor 410 communicates with memory 430 via line 435. Processor 410 also communicates with display screen 440 via line 445. An antenna/receiver 450, such as a GPS antenna/receiver is connected to processor 410 via line 455. It will be understood that the antenna and receiver, designated by reference numeral 450, are combined schematically for illustration, but that the antenna and receiver may be separately located components, and that the antenna may be a GPS patch antenna or a helical antenna. The electronic components further include I/O ports 470 connected to processor 410 via line 475.

Figure 4B:
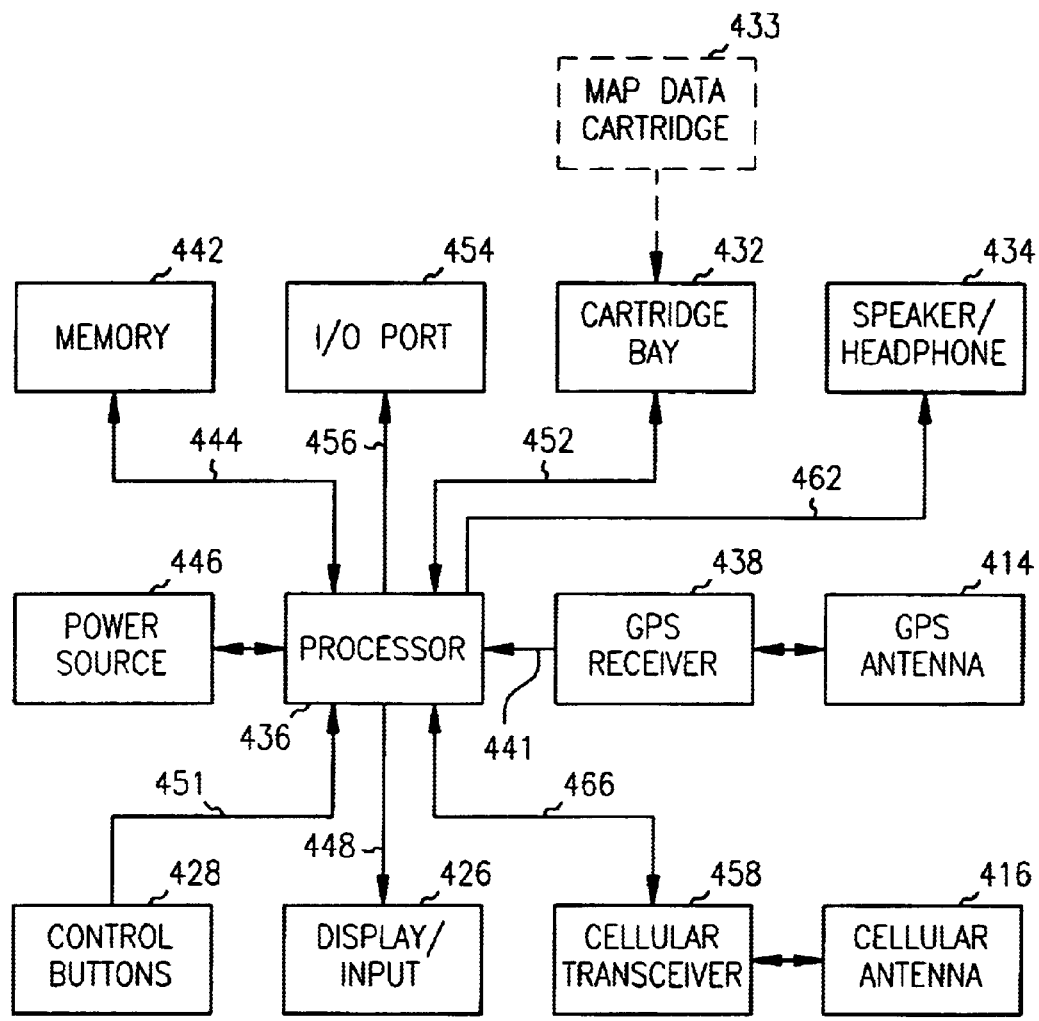
FIG. 4B is a block diagram of one embodiment for the electronic components within the hardware of FIGS. 3A–3C.

FIG. 4B is a block diagram of one embodiment for the electronic components within the hardware of FIGS. 3A–3C and utilized by the GPS integrated PDA 310 according to the teachings of the present invention. The electronic components shown in FIG. 4B include a processor 436 which is connected to the GPS antenna 414 through GPS receiver 438 via line 441. The processor 436 interacts with an operating system (such as PalmOS; Pocket PC) that runs selected software depending on the intended use of the PDA 310. Processor 436 is coupled with memory 442 such as RAM via line 444, and power source 446 for powering the electronic components of PDA 310. The processor 436 communicates with touch sensitive display screen 426 via data line 448.

The electronic components further include two other input sources that are connected to the processor 436. Control buttons 428 are connected to processor 436 via line 451 and a map data cartridge 433 inserted into cartridge bay 432 is connected via line 452. A conventional serial I/O port 454 is connected to the processor 436 via line 456. Cellular antenna 416 is connected to cellular transceiver 458, which is connected to the processor 436 via line 466. Processor 436 is connected to the speaker/headphone jack 434 via line 462. The PDA 310 may also include an infrared port (not shown) coupled to the processor 436 that may be used to beam information from one PDA to another.

As will be understood by one of ordinary skill in the art, the electronic components shown in FIGS. 4A and 4B are powered by a power source in a conventional manner. As will be understood by one of ordinary skill in the art, different configurations of the components shown in FIGS. 4A and 4B are considered within the scope of the present invention. For example, in one embodiment, the components shown in FIGS. 4A and 4B are in communication with one another via wireless connections and the like. Thus, the scope of the navigation device of the present invention includes a portable electronic navigational aid device.

According to the teachings of the present invention, the electronic components embodied in FIGS. 4A and 4B are adapted to provide an electronic navigational aid device with cartographic data or other data as applicable. That is, according to the teachings of the present invention, a processor 410 is provided with the electronic navigational aid device, and a memory 430 is connected to the processor 410. The memory 430 includes canonical Huffman encoded data and a decoding structure. A display 440 is connected to the processor 410 and is capable of displaying the decoded data to a user.

As will be discussed in more detail below, the processor 410 and memory 430 cooperate to perform various processes according to the teachings of the present invention. According to one embodiment, the processor 410 and memory 430 cooperate to perform a $2^N$-deep direct-index lookup using N bits from canonical Huffman encoded data. High-frequency data is extracted based on the direct-index lookup. Bracketing indices are provided for low-frequency data based on the direct-index lookup. A binary search is performed using the bracketing indices to provide a low-frequency symbol index, and the low-frequency data associated with the low-frequency data is extracted.

Figure 5:
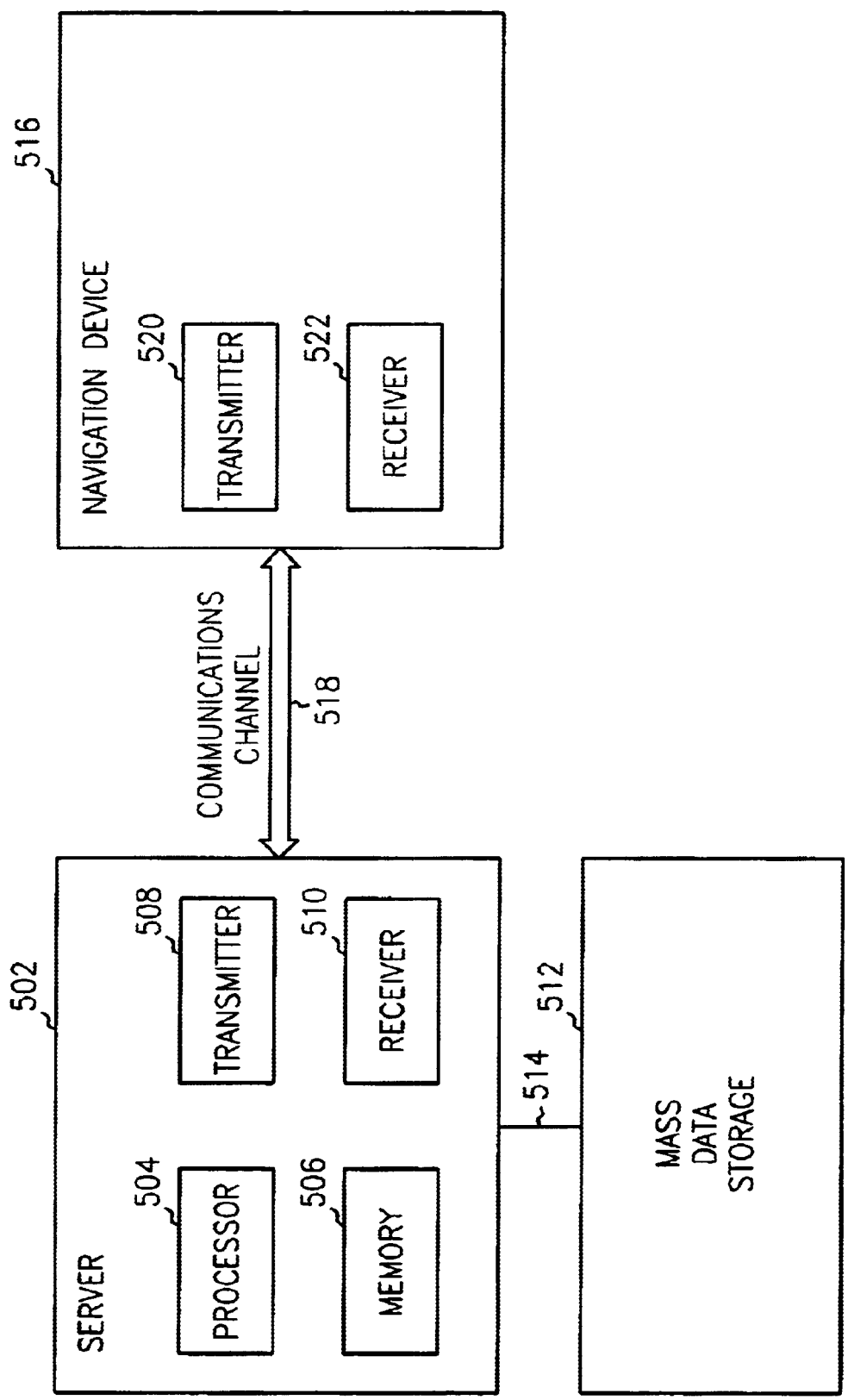
FIG. 5 is a block diagram of a navigation system.

FIG. 5 is a block diagram of an embodiment of a navigation system. The navigation system 500 includes a server 502. According to one embodiment, the server 502 includes a processor 504 operably coupled to memory 506, and further includes a transmitter 508 and a receiver 510 to send and receive communication signals. The transmitter 508 and receiver 510 are selected or designed according to the communication requirements and the communication technology used in the communication design for the navigation system. The functions of the transmitter 508 and the receiver 510 may be combined into a single transceiver.

The navigation system further includes a mass data storage 512 coupled to the server 502 via communication link 514. The mass data storage 512 contains a store of navigation data. One of ordinary skill in the art will understand, upon reading and comprehending this disclosure, that the mass data storage 512 can be a separate device from the server 502 or can be incorporated into the server 502.

According to one embodiment, the navigation system further includes a navigation device 516 adapted to communicate with the server 502 through the communication channel 518. According to one embodiment, the navigation device 516 includes a processor and memory, as previously shown and described with respect to the block diagrams of FIGS. 4A and 4B. Furthermore, the navigation device 516 includes a transmitter 520 and receiver 522 to send and receive communication signals through the communication channel 518. The transmitter 520 and receiver 522 are selected or designed according to the communication requirements and the communication technology used in the communication design for the navigation system. The functions of the transmitter 520 and receiver 522 may be combined into a single transceiver.

Software stored in the server memory 506 provides instructions for the processor 504 and allows the server 502 to provide services to the navigation device 516. One service provided by the server 502 involves processing requests from the navigation device 516 and transmitting navigation data from the mass data storage 512 to the navigation device 516. According to one embodiment, another service provided by the server 502 includes processing the navigation data using various algorithms for a desired application, and sending the results of these calculations to the navigation device 516.

The communication channel 518 is the propagating medium or path that connects the navigation device 516 and the server 502. According to one embodiment, both the server 502 and the navigation device 516 include a transmitter for transmitting data through the communication channel and a receiver for receiving data that has been transmitted through the communication channel.

The communication channel 518 is not limited to a particular communication technology. Additionally, the communication channel 518 is not limited to a single communication technology; that is, the channel 518 may include several communication links that use a variety of technology. For example, according to various embodiments, the communication channel is adapted to provide a path for electrical, optical, and/or electromagnetic communications. As such, the communication channel includes, but is not limited to, one or a combination of the following: electrical circuits, electrical conductors such as wires and coaxial cables, fiber optic cables, converters, radio-frequency (RF) waveguides, the atmosphere, and empty space. Furthermore, according to various embodiments, the communication channel includes intermediate devices such as routers, repeaters, buffers, transmitters, and receivers, for example.

In one embodiment, for example, the communication channel 518 includes telephone and computer networks.

Furthermore, in various embodiments, the communication channel 516 is capable of accommodating wireless communication such as radio frequency, microwave frequency and infrared communication, and the like. Additionally, according to various embodiments, the communication channel 516 accommodates satellite communication.

The communication signals transmitted through the communication channel 518 include such signals as may be required or desired for a given communication technology. For example, the signals may be adapted to be used in cellular communication technology, such as time division multiple access (TDMA), frequency division multiple access (FDMA), code division multiple access (CDMA), global system for mobile communications (GSM), and the like. Both digital and analog signals may be transmitted through the communication channel 518. According to various embodiments, these signals are modulated, encrypted and/or compressed signals as may be desirable for the communication technology.

The mass data storage includes sufficient memory for the desired navigation application. Examples of mass data storage include magnetic data storage media such as hard drives, optical data storage media such as CD ROMs, charge storing data storage media such as Flash memory, and molecular memory.

According to one embodiment of the navigation system, the 502 server includes a remote server accessed by the navigation device 516 through a wireless channel. According to other embodiments of the navigation system, the server 502 includes a network server located on a local area network (LAN), wide area network (WAN), a virtual private network (VPN) and server farms.

According to another embodiment of the navigation system, the server 502 includes a personal computer such as a desktop or laptop computer. In one embodiment, the communication channel 518 is a cable connected between the personal computer and the navigation device. According to one embodiment, the communication channel 518 is a wireless connection between the personal computer and the navigation device 516.

As will be discussed in more detail below, the system performs various processes according to the teachings of the present invention. According to one embodiment, the mass data storage 512 is adapted to store navigation data, and in particular to store canonical Huffman encoded navigation data. According to various embodiments, the encoded navigation data includes text, images and/or audio. Huffman codes and canonical Huffman codes will be described in more detail below. The server 502 communicates with the mass data storage 512, and thus is able to access and/or process the canonical Huffman encoded navigation data. The navigation device 516 communicates with and retrieves navigation data from the server 502 via a communication channel 518.

The navigation device includes a processor and a memory connected to the processor, as previously described with respect to the devices of FIGS. 4A and 4B. According to one embodiment, the processor and memory of the navigation device are adapted to cooperate to perform a $2^N$-deep direct-index lookup using N bits from canonical Huffman encoded navigation data. That is, N bits are used to directly look up any symbol up to N bits in length. High-frequency data is extracted based on the direct-index lookup. Bracketing indices are provided for low-frequency data based on the direct-index lookup. A binary search is performed using the bracketing indices to provide a low-frequency symbol index, and the low-frequency data associated with the low-frequency data is extracted.

Huffman coding is a well-known method for compressing certain types of data, particularly text. Huffman code associates a character with a particular bit pattern. The length of the bit pattern is varied for the purpose of striving to achieve the shortest average code length for a given input alphabet. Huffman code has been described as a data compression algorithm that replaces frequently occurring characters and data strings with shorter codes. Huffman encoding reads the information a first time to determine the frequency with which each data character appears and a second time to accomplish the actual encoding process.

The Huffman code is generated as part of a tree-forming process. The process starts by listing the input alphabet symbols, along with their probabilities or relative frequencies, in order of occurrence. Each branch is assigned a branch weight equal to the relative frequency of the symbols. The two entries or branches with the lowest relative frequency are merged at a branch node to form a new branch with their composite probabilities. This newly formed branch and the remaining branches are reordered or bubbled according to their relative frequency. Should the newly formed branch have the same relative frequency as one or more existing branches, the newly formed branch is bubbled on top of those branches. The merging and bubbling process repeats until the input alphabet is coded.

Figure 6:
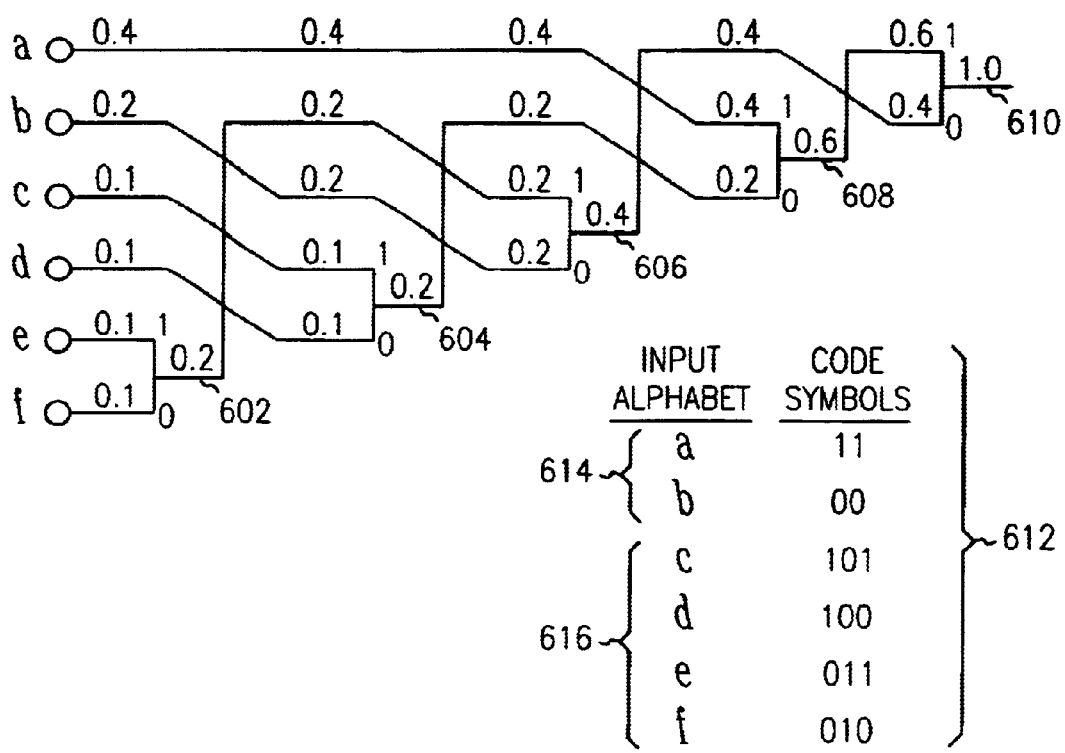
FIG. 6 illustrates a conventional Huffman coding tree for a six-character set.

FIG. 6 illustrates a conventional Huffman coding tree for a six-character set. In this example, the relative frequency of "a", "b", "c", "d", "e" and "f" are 0.4, 0.2, 0.1, 0.1, 0.1 and 0.1 respectively. Branches "e" and "f", the two lowest branches with a relative frequency of 0.1, are merged to form a new branch 602 with a relative frequency of 0.2. This new branch 602 is reordered above "b", which is another branch with a relative frequency of 0.2. The lowest branches are then branches "c" and "d", each with a relative frequency of 0.1. Branches "c" and "d" are merged to form a new branch 604 with a relative frequency of 0.2, which is reordered above the branch 602 that combines "e" and "f". Branch "b" and the branch 602 that combines branches "e" and "f", each with a relative frequency of 0.2, are merged to form a new branch 606 with a relative frequency of 0.4. This new branch 606 is reordered above branch "a". Branch "a", which has a reference frequency of 0.4, and the branch 604 that combines branches "c" and "d", which has a reference frequency of 0.2, are merged to form a new branch 608 with a reference frequency of 0.6. This new branch 608 is reordered above the branch 606 that combines branches "b", "e" and "f". The branch 608 that combines branches "a", "c" and "d", which has a reference frequency of 0.6, is merged with the branch 606 that combines branches "b", "e" and "f", which has a reference frequency of 0.4, to form a branch 610 with a reference frequency of 1.0.

The branch nodes are labeled with a binary 1/0 decision to distinguish the two branches that extend from each node. The labeling process can be somewhat arbitrary, although as will be explained in more detail below with respect to canonical Huffman codes, certain benefits are obtained by following certain coding rules. In this example, the label "1" is on the upper branch and the label "0" is applied to the lower branch. The result is the code symbols 612 illustrated in FIG. 6.

It is noted that the higher-frequency characters 614 "a" and "b" are encoded with two bits and the lower-frequency characters 616 "c", "d", "e" and "f" are encoded with three bits. Shorter code lengths for higher-frequency characters provide a shorter average code length for a given alphabet.

Figure 7:
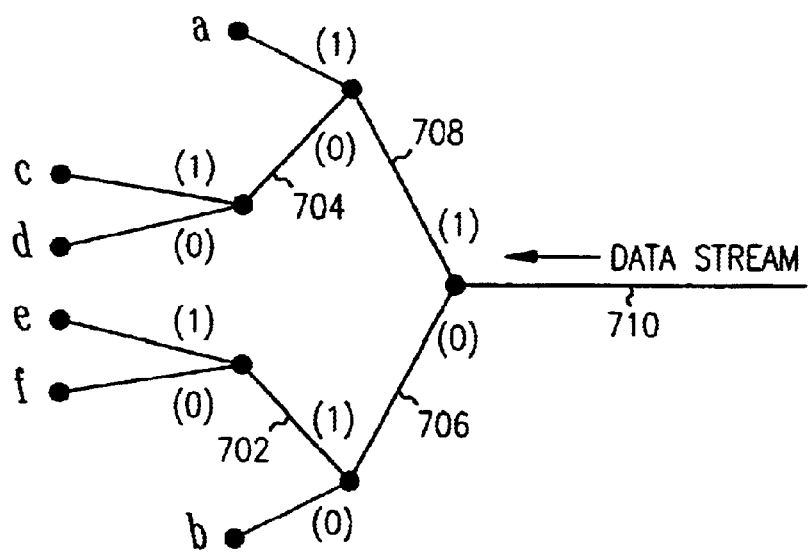
FIG. 7 illustrates a conventional Huffman decoding tree for the Huffman code example developed in FIG. 6.

FIG. 7 illustrates a conventional Huffman decoding tree for the Huffman code example developed in FIG. 6. The branches 702, 704, 706, 708 and 710 of FIG. 7 correspond to branches 602, 604, 606, 608 and 610 in FIG. 6. A data stream arrives at the first node along branch 710 as shown. If the first two bits in the data stream are "1,1", then the character "a" is decoded. If the first three bits in the data stream are "0, 1, 1", then the character "e" is decoded.

Canonical Huffman codes are Huffman codes that follow certain rules to improve the efficiency of the decoding process. One rule is that shorter codes, when filled with zeros to the right, have a numerically higher value than longer codes. Another rule is that numerical values within the same length increase with the alphabet. One benefit of these rules is that, as will be provided in more detail below, the code can be completely reconstructed knowing only the code lengths for each symbol.

Figure 8:
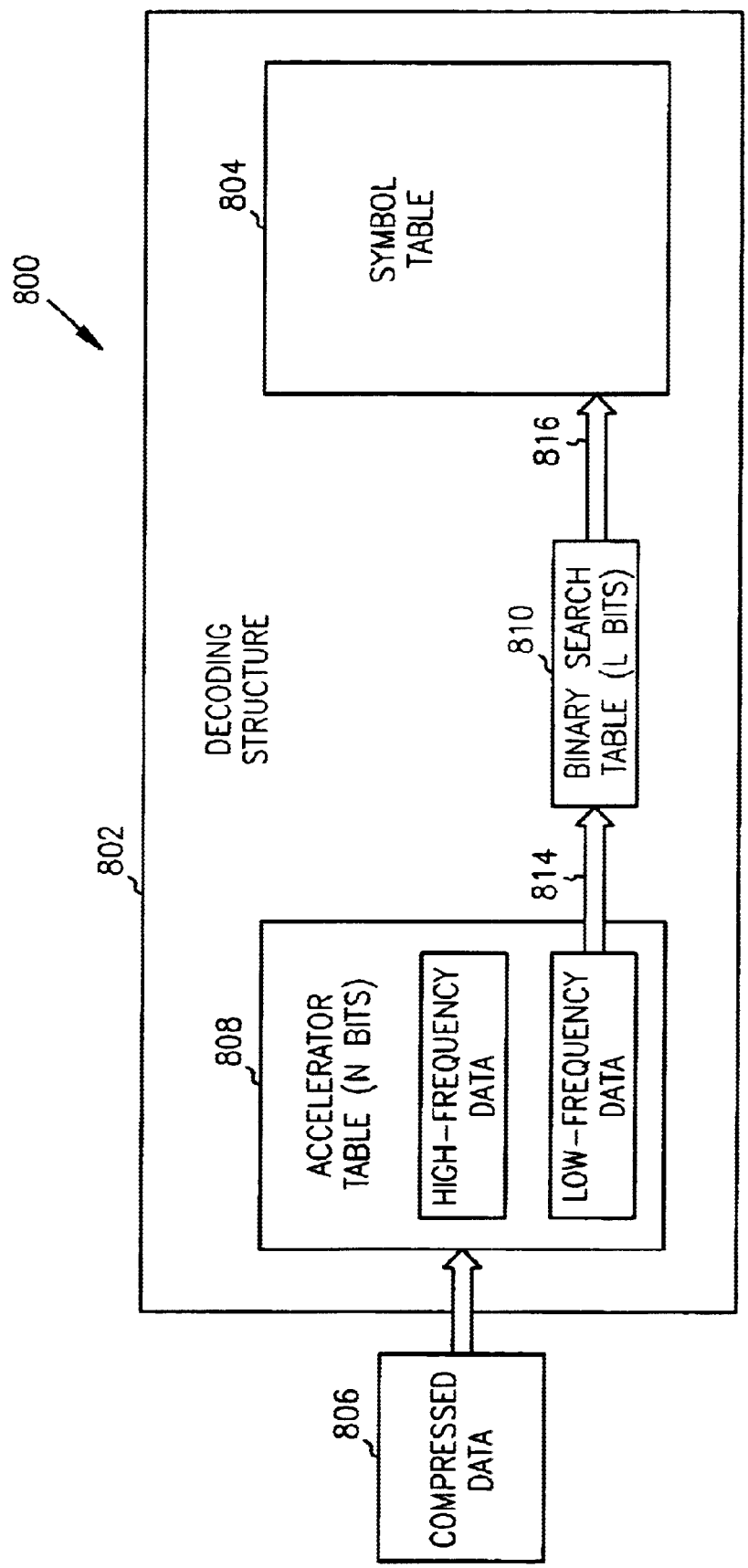
FIG. 8 is a block diagram of a data structure according to the present invention.

FIG. 8 is a block diagram of a data structure according to the present invention. The data structure 800 includes a decoding structure 802 and a symbol table 804. In one embodiment, the data structure 800 further includes compressed data 806. The compressed data 806 includes canonical Huffman encoded data. The decoding structure 802 receives a bit stream of data or otherwise accesses a data string from the compressed data 806, and provides indices to extract the appropriate data or symbol for the code from the symbol table 804.

The decoding structure 802 includes an acceleration table 808. The speed of the decoding operation depends in part on N, the depth selected for the acceleration table 808. A small value for N results in a comparatively small acceleration table, but requires more secondary searches in the binary search table 810. A large value for N results in a large acceleration table, but many symbols are decoded with a single direct-index lookup. As the selected value for parameter N is increased, the storage space to house a table of $2^N$ elements increases significantly. According to one embodiment of the present invention, N is chosen to be comparatively small to minimize storage for the decoding structure 802. According to another embodiment of the present invention, the value of N is chosen comparatively large to afford speed in the decoding process. In yet another embodiment of the present invention, the value of N is chosen using the distribution frequencies found in the encoding process to ensure a symbol can be decoded in one lookup step for a specified percentage of cases. For example, in the foregoing discussion, the characters 'a' and 'b' were both assigned a Huffman code length of two bits, and taken together, comprised 60% of the uncompressed data. So a selection of N=2 would yield an acceleration table of $2^2$=4 entries, and would decode a symbol in one lookup into the table 60% of the time. It is a goal of the present invention to allow such flexibility during the encoding phase to make optimal use of available storage space, and processing capability.

The decoding structure 802 includes an accelerator table 808 and a binary search table 810. N bits from the compressed data, i.e. the first N bits from the encoded data stream, are received or accessed. A $2^N$-deep direct-index into the accelerator table 808 is performed to extract high-frequency data from the symbol table 804. High-frequency data is data characterized as data with a code length of N bits or less. The $2^N$-deep direct-index provides bracketing indices 814 to the binary search table 810 for low-frequency data. Low-frequency data is characterized as data with a code length greater than N bits. As will be described in more detail below, due to the nature of the canonical Huffman encoded data, the bracketing indices 814 limit the binary search so as to increase the speed of the binary search process, which increases the speed for providing a low-frequency symbol index 816 to extract low-frequency data from the symbol table 804.

Figure 9:
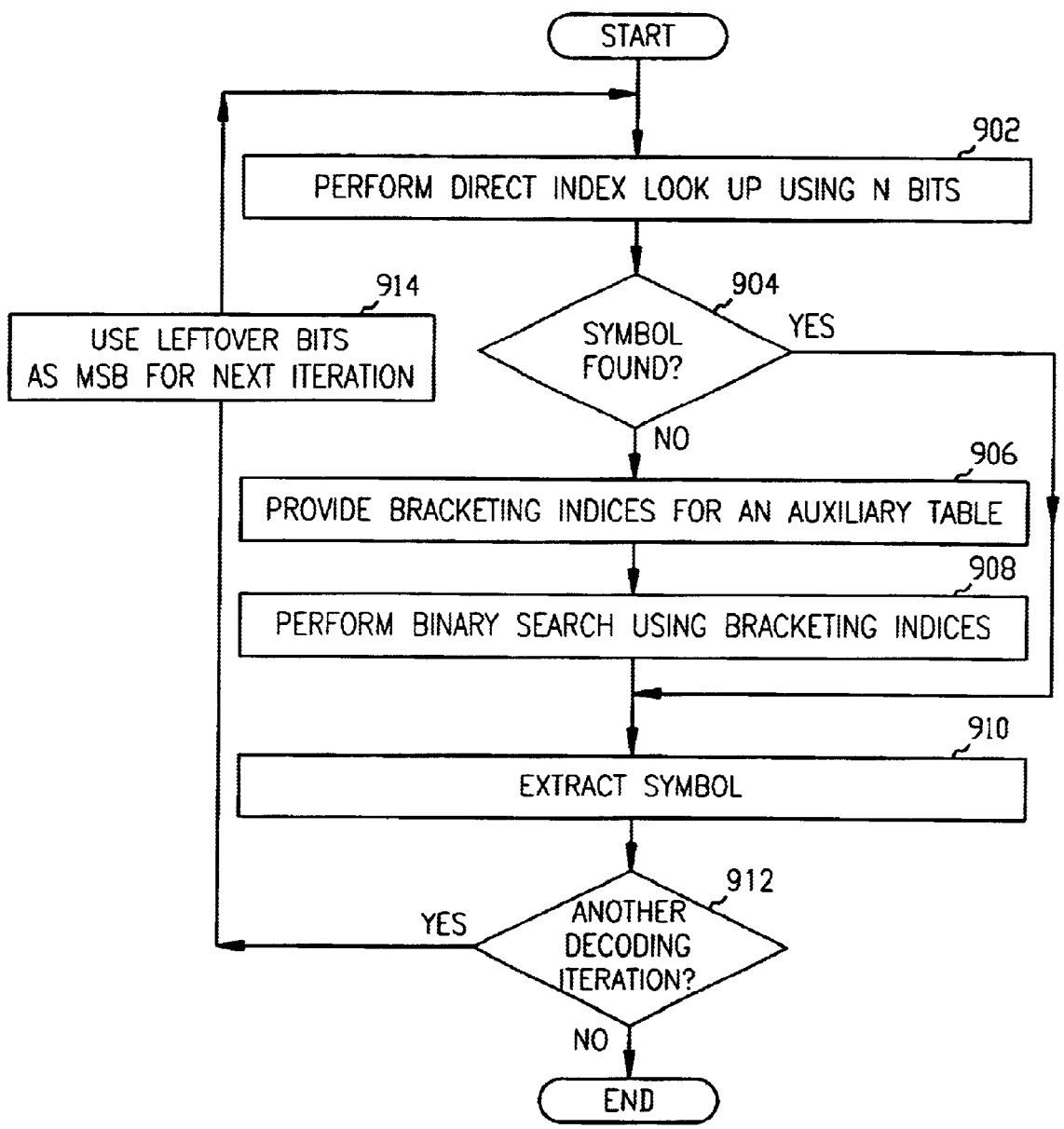
FIG. 9 is a flow diagram illustrating one decoding process embodiment according to the present invention.

FIG. 9 is a flow diagram illustrating one decoding process embodiment according to the present invention. According to this embodiment, a $2^N$-deep direct-index lookup is performed using N-bits at 902. This direct-index lookup is performed in the accelerator table shown in FIG. 8. At 904, it is determine whether a symbol or data is found using the N-bit index. It is noted again here that a symbol that is found using the N-bit index can be characterized as a high-frequency symbol, and a symbol that is not found using the N-bit index can be characterized as a low-frequency symbol.

Upon determining that a symbol has not been found using the N bits, the $2^N$-deep direct-index lookup provides bracketing indices for an auxiliary table, i.e. the binary search table shown in FIG. 8, at 906. At 908, a binary search is performed in the auxiliary table using the bracketing indexes. A low-frequency symbol index is produced to extract a low-frequency symbol from the symbol table at 910. If, at 904, it is determined that symbol is found with the $2^N$-deep direct-index lookup, the process proceeds to 910 to extract a high-frequency symbol. According to one embodiment, the direct-index table provides the high-frequency symbols.

At 912, it is determined whether there is another decoding iteration to be performed. Upon determining that there is another decoding iteration to be performed, the process proceeds to 914 where the leftover bits are used as the most significant bits (MSB) for the next decoding iteration, and then proceeds back to 902 to perform another direct-index lookup using N bits.

Figure 10A:
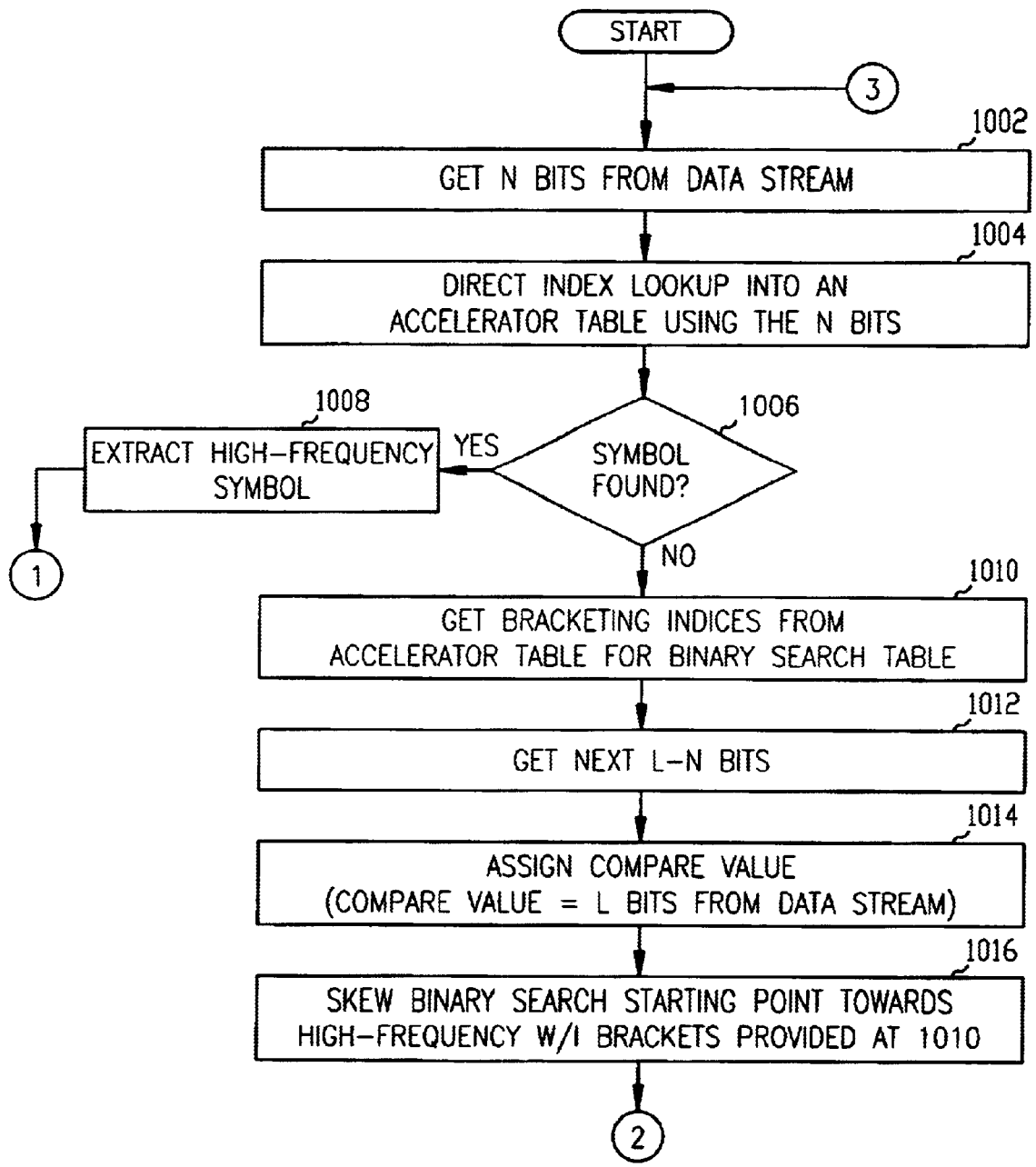
FIGS. 10A and 10B provide a flow diagram illustrating one decoding process embodiment according to the present invention.
Figure 10B:
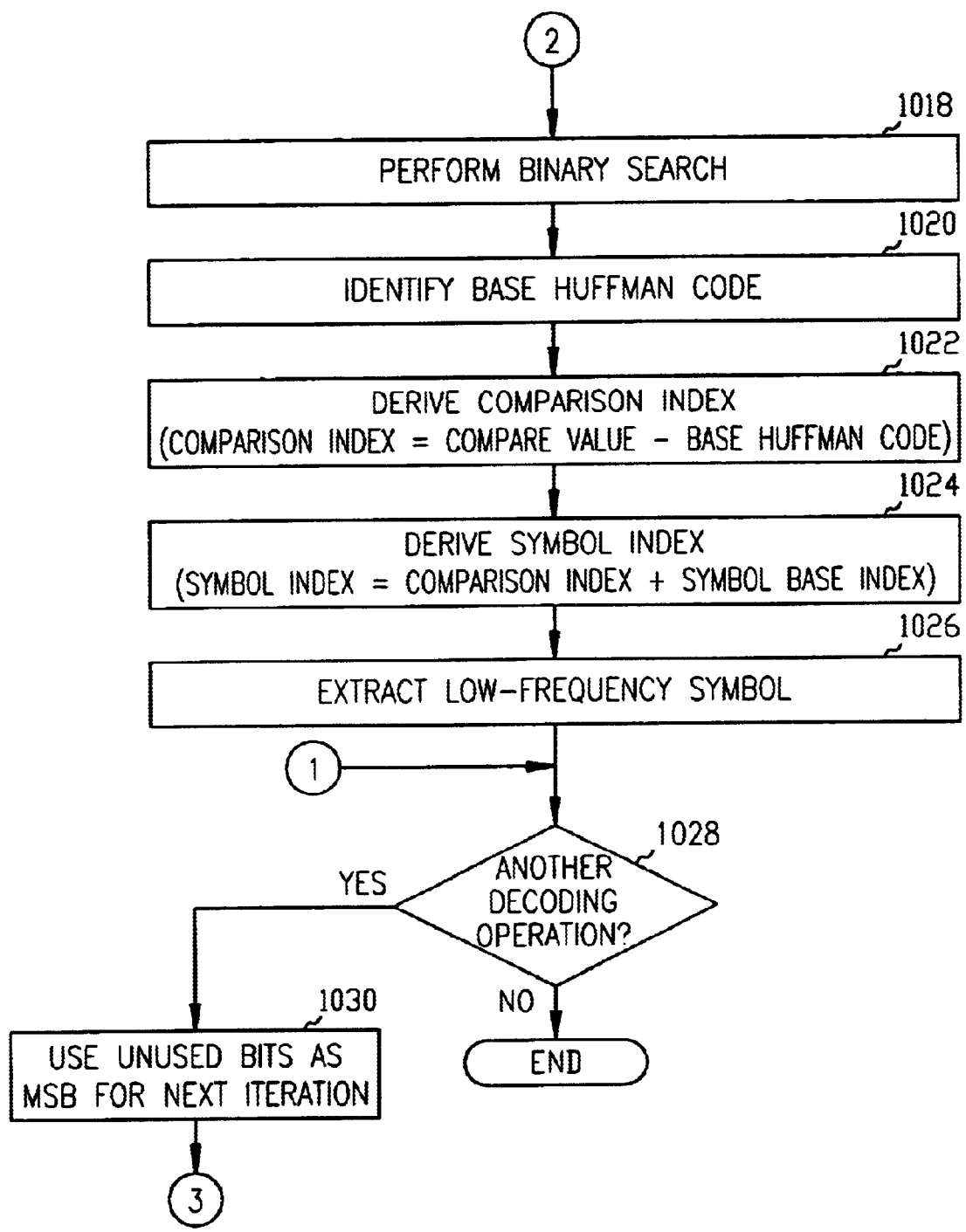

FIGS. 10A and 10B provide a flow diagram illustrating one decoding process embodiment according to the present invention. According to this embodiment, a command is performed, at 1002, to get N bits from a data stream or to otherwise access the coded data. N is the number of bits used in a direct-index lookup. At 1004, a direct-index lookup into an accelerator table is performed using the N bits. At 1006, it is determined whether a symbol is found using the N bits. Upon determining that a symbol is found using the N bits, a high-frequency symbol is extracted at 1008.

Upon determining that a symbol is not found using the N bits, the process proceeds to 1010, where a command is performed to get bracketing indices from the accelerator table to be used to limit the scope of a binary search performed in the binary search table. At 1012, a command is performed to get additional bits from the data stream or to otherwise access additional bits from the coded data. These additional bits are added to the N bits to form a total of L bits. L is the number of bits used in the longest Huffman code, and determines the width of the compare code used in the binary search table. At 1014, a compare value is assigned to the resulting L-bit data string. This compare value is used in an upcoming binary search.

According to one embodiment as shown at 1016, the starting point for an upcoming binary search within established bracket limits is skewed towards the higher-frequency bit pattern to improve the speed of the binary search. At 1018, the binary search is performed, and a base Huffman code for the compare value is identified at 1020. At 1022, a comparison index is determined based on the compare value and the base Huffman code. At 1024, a low-frequency symbol index is derived from the previously derived comparison index and a symbol base index, which is stored in the binary search table and associated with one of the base Huffman codes stored therein. A low-frequency symbol is extracted at 1026 using the derived low-frequency symbol index.

From either 1008, where a high-frequency symbol is extracted, or from 1026, where a low-frequency symbol is extracted, the process proceeds to 1028 where it is determined whether another decoding iteration is to be performed on the canonical Huffman encoded data. Upon determining that another decoding iteration is to be performed, the bits that were not used in the preceding decoding iteration are identified at 1030 and used to form the most significant (MSB) data bits for the next decoding iteration. An N-bit data string is shifted to reuse the bits that were not used to extract high-frequency data in a subsequent iteration, and an L-bit data string is shifted to reuse the bits that were not used to extract low-frequency data in a subsequent iteration. The process proceeds back to 1002, where the iterative decoding process continues. Upon determining that another decoding iteration is not to be performed, the process ends.

Device, system, data structure, and method aspects of the present invention have been described above by way of example. Tables of canonical encoded data are shown and described below to provide an example of decoding canonical Huffman codes. In this example, 50 symbols are present in the uncompressed data, and are distributed such that the longest Huffman Code is 16 bits, and the shortest is 4 bits. The "symbol" is alphabetic or a control character in this example, but could be other binary data as well.

FIGS. 11A, 11B and 11C illustrate a table containing assigned canonical Huffman codes for symbols. One of ordinary skills in the art will understand how to use known methods and algorithms to assign the codes. The table includes assigned canonical Huffman codes that have the most significant bit (MSB) on the left and the least significant bit (LSB) on the right. The table also includes a bit length column, a symbol index column, and a symbol column. The symbol index column provides indices for extracting the symbols shown in the symbol column, which according to one embodiment, are stored in a separate symbol table. However, the symbol column is provided as part of this table for ease of illustration.

The table shows that the codes are grouped according to their code length, as represented by the values in the Bit Length column. Additionally, the table shows that shorter codes have a numerical value that is larger than longer codes. The blank squares correspond to a "don't care" condition during decoding. The codes are assigned sequentially within a code length.

The codes having the same bit length form a group. These groups are denoted by the reference numeral 1102. The bit length of the code associated with each symbol is determined by the relative probability of the symbol. Symbols that have shorter codes have a higher relative probability than symbols with longer codes. The shorter codes are provided at the bottom of the table. Symbols represented by codes that have the same bit length either have or are close to having the same relative probability as the other symbols in that group.

A base canonical Huffman code is associated with each group, and the remainder of the codes in that group sequentially follow the base canonical Huffman code. For example, as shown in FIG. 11A, the bit sequence "0000000010" is the base canonical Huffman code for the group whose codes are ten bits long; as shown in FIG. 11B, the bit sequence "0000100" is the base canonical Huffman code for the group whose codes are seven bits long; and as shown in FIG. 11C, the bit sequence "00111" is the base canonical Huffman code for the group whose codes are five bits long.

Referring to the five-bit long code group shown in FIG. 11 C, the symbols associated with this group are "C", "I", "K", "S", and a hexadecimal control character with value 1B. These symbols are sorted in alphabetical order and are assigned canonical Huffman codes that sequentially follow the base canonical Huffman code "00111". For example, "C" is assigned the code "00111"+"1"("C"="01000") and "S" is assigned the code "00111"+"4" ("S"="01011"). The "1" and "4" are examples of a comparison index. The comparison index is determined by subtracting the base canonical Huffman code from the value of the L-bit data string.

FIG. 12 illustrates an example of a binary search table as shown in the data structure of FIG. 8. The binary search table contains the base canonical Huffman code for each group of codes. Additionally, the binary search table includes a Bits Used column and a Symbol Base Index column such that each base canonical Huffman code is associated with a number of bits and with a symbol base index.

Decoding logic performs the following logic on the binary search table to extract a symbol. An L-bit data string is assigned a compare value. The value of L represents the number of bits of the longest code, and is 16 in this example. As one of ordinary skill in the art will understand upon reading and comprehending this disclosure, the value of L depends on the symbol distribution in the uncompressed data. A binary search is performed on the search table, and the proper row and base canonical Huffman code for this compare value is identified. According to one embodiment, the starting point for this binary search is skewed toward the high-frequency end of the table, i.e. toward the bottom in the illustrated table, rather than toward the middle of the table to reduce the number of iterations required for the higher-frequency data. The compare value is subtracted from the base canonical Huffman code to derive a comparison index. The comparison index is added to the symbol base index to provide a desired symbol index for an associated symbol in the symbol table as shown in FIG. 8. The unused bits are used as the most significant bits (MSB) of the next decoding iteration.

FIG. 13 illustrates an example of an accelerator table as shown in the data structure of FIG. 8. The accelerator table is a direct-index lookup table that extracts high-frequency data in a single lookup at the expense of incurring extra indirection for low-frequency data. The illustrated accelerator table includes a Table Index column, a Bits Used column, a Symbol column, a Search Table Start Index column and a Search Table End Index column.

The Table Index column contains bit strings from the canonical Huffman encoded data. The length of these bit strings are N bits long, wherein N represents the number of bits used in the direct-index lookup table. Thus, the direct-index lookup table provides a $2^N$-deep direct index. In the illustrated example table, the bit strings are five bits long. Therefore, for this example, symbols whose canonical Huffman codes are five bits long or shorter are decoded by the accelerator table. With respect to symbols whose canonical Huffman codes are longer than five bits long, the five-bit-deep direct-index lookup produces bracketing indices, as represented by the values in the Search Table Start Index and the Search Table End Index columns. The values in the Search Table Start Index and the Search Table End Index columns correspond to the Table Index column in the binary search table, which was discussed with respect to FIG. 12. For example, the five bit sequence "00010" results in a binary search being performed for the binary search table indices 8–9.

In some embodiments, the methods provided above are implemented as a computer data signal embodied in a carrier wave or propagated signal, that represents a sequence of instructions which, when executed by a processor, such as processor 410 in FIG. 4A, processor 436 in FIG. 4B or processor 504 in FIG. 5, cause the processor to perform the respective method. In other embodiments, methods provided above are implemented as a set of instructions contained on a computer-accessible medium, such as memory 430 in FIG. 4A, memory 442 in FIG. 4B or mass storage device 512 in FIG. 5, capable of directing a processor, such as processor 410 in FIG. 4A, processor 436 in FIG. 4B or processor 504 in FIG. 5, to perform the respective method. In varying embodiments, the medium is a magnetic medium, an electronic medium, or an optical medium.

As one of ordinary skill in the art will understand upon reading this disclosure, the electronic components of device shown in FIGS. 4A and 4B and components of the system 500 shown in FIG. 5 can be embodied as computer hardware circuitry or as a computer-readable program, or a combination of both. In another embodiment, system 500 is implemented in an application service provider (ASP) system.

The system of the present invention includes software operative on a processor to perform methods according to the teachings of the present invention. One of ordinary skill in the art will understand, upon reading and comprehending this disclosure, the manner in which a software program can be launched from a computer readable medium in a computer based system to execute the functions defined in the software program. One of ordinary skill in the art will further understand the various programming languages which may be employed to create a software program designed to implement and perform the methods of the present invention. The programs can be structured in an object-orientation using an object-oriented language such as Java, Smalltalk or C++, and the programs can be structured in a procedural-orientation using a procedural language such as COBOL or C. The software components communicate in any of a number of means that are well-known to those skilled in the art, such as application program interfaces (A.P.I.) or interprocess communication techniques such as remote procedure call (R.P.C.), common object request broker architecture (CORBA), Component Object Model (COM), Distributed Component Object Model (DCOM), Distributed System Object Model (DSOM) and Remote Method Invocation (RMI). However, as will be appreciated by one of ordinary skill in the art upon reading this disclosure, the teachings of the present invention are not limited to a particular programming language or environment.

CONCLUSION

The above systems, devices and methods have been described, by way of example and not by way of limitation, with respect to improving accuracy, processor speed and ease of user interaction with a navigation device that has limited memory and processor capabilities. That is, the systems, devices and methods provide for compressing data, and in particular for coding and decoding data using canonical Huffman codes. An acceleration table is provided to extract high-frequency data using a direct-index lookup and bracketing indices to provide bounds for a binary search. A binary search table is provided to extract base conical Huffman codes for each bit length of the encoded data, from which low-frequency data indices are derived to extract low-frequency data. Thus, the present invention provides design flexibility by allowing choices to be made to increase decoding speed by adding more space to the acceleration table in the decoding structure or to decrease the decoding structure space to conserve memory space while acceptably decreasing the decoding speed. A faster decoding speed allows a navigation device to provide more navigation data to a user more rapidly. A smaller decoding structure allows more memory in the limited memory of the navigation device to be allocated for other purposes at the expense of an acceptable decrease in decoding speed.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. It is to be understood that the above description is intended to be illustrative, and not restrictive. Combinations of the above embodiments, and other embodiments will be apparent to those of skill in the art upon reviewing the above description. The scope of the invention includes any other applications in which the above systems, devices and methods are used. The scope of the invention should be determined with reference to the appended claims, along with the full scope of equivalents to which such claims are entitled.

What is claimed is:

1. A data structure stored on a computer readable medium, comprising:
a field representing a decoding structure to decode canonical Huffman encoded data, the decoding structure including:
a field representing an accelerator table to perform a $2^N$-deep direct-index lookup of the encoded data to provide a high-frequency symbol for high-frequency data and to provide bracketing indices for low-frequency data; and
a field representing a binary search table to provide a symbol index using a binary search bounded by the bracketing indices; and
a field representing a symbol table to provide a symbol associated with the symbol index.

2. The data structure of claim 1, wherein the accelerator table and the binary search table each have a size that is capable of being determined for an application design.

3. The data structure of claim 2, wherein the decoding structure has a decoding speed, and wherein increasing the size of the accelerator table improves the decoding speed by increasing the value of N in the $2^N$-deep direct-index lookup such that the accelerator table is adapted to provide more high-frequency symbols.

4. The data structure of claim 2, wherein the decoding structure has a decoding speed, and wherein decreasing the size of the accelerator table decreases an overall size of the decoding structure and decreases the processing speed by decreasing the value of N in the $2^N$-deep direct index lookup such that the accelerator table is adapted to provide fewer high-frequency symbols.

5. The data structure of claim 1, wherein the accelerator table includes a symbol column to provide symbols for the high-frequency data that has a code length less than or equal to N bits.

6. The data structure of claim 1, wherein the accelerator table includes a binary search table start index column and a binary search table end index column to provide the bracketing indices for the low frequency data that has a code length longer than N bits.

7. The data structure of claim 1, wherein the encoded data that have an equal bit length are categorized in a symbol group, and wherein the binary search table includes a base canonical Huffman code for each symbol group and a base symbol index column to provide a base symbol index for each base canonical Huffman code.

8. The data structure of claim 1, further comprising a field containing the canonical Huffman encoded data.

9. An electronic navigational aid device, comprising:
a processor; and
a memory connected to the processor, wherein the processor and memory are adapted to cooperate to:
perform a $2^N$-deep direct-index lookup using N bits from canonical Huffman encoded data,
extract high-frequency symbols based on the direct-index lookup,
provide bracketing indices for low-frequency data based on the direct-index lookup,
perform a binary search using the bracketing indices to provide a low-frequency symbol index, and
extract the low-frequency symbols associated with the low-frequency symbol index.

10. The electronic navigational aid device of claim 9, wherein the electronic navigational aid device further comprises a portable electronic navigational aid device.

11. The electronic navigational aid device of claim 10, wherein the portable electronic navigational aid device includes a personal digital assistant (PDA).

12. The electronic navigational aid device of claim 10, wherein the portable electronic navigational aid device includes a wireless communication device.

13. The electronic navigational aid device of claim 9, wherein the value of N for the $2^N$-deep direct-index is determined for an application design by balancing competing needs for decoding speed and memory space.

14. The electronic navigational aid device of claim 9, wherein the memory is adapted to store a data structure, the data structure including:
a field containing canonical Huffman encoded data, the encoded data including high-frequency data and low-frequency data;
a field representing a decoding structure to decode the encoded data, the decoding structure including:
a field representing an accelerator table to perform the $2^N$-deep direct-index lookup to provide the high-frequency symbols for the high-frequency data and to provide the bracketing indices for the low-frequency data;
a field representing a binary search table to provide the low-frequency symbol index using the binary search bounded by the bracketing indices; and
a field representing a symbol table to provide the low-frequency symbols associated with the low-frequency symbol index.

15. The electronic navigational aid device of claim 14, wherein the accelerator table and the binary table each have a size that is capable of being determined at a time when the canonical Huffman encoded data is coded.

16. The electronic navigational aid device of claim 14, wherein increasing the size of the accelerator table improves decoding speed by increasing a value of N in the $2^N$-deep direct-index lookup such that the accelerator table is adapted to provide more high-frequency symbols.

17. The electronic navigational aid device of claim 14, wherein decreasing the size of the accelerator table decreases an overall size of the decoding structure and decreases the decoding speed by decreasing a value of N in the $2^N$-deep direct index lookup such that the accelerator table is adapted to provide less high-frequency symbols.

18. The electronic navigational aid device of claim 14, wherein the accelerator table includes a symbol index column to provide high-frequency indices for the high-frequency data that has a code length less than or equal to N bits.

19. The electronic navigational aid device of claim 14, wherein the accelerator table includes a binary search table start index column and a binary search table end index column to provide the bracketing indices for the low frequency data that has a code length longer than N bits.

20. The electronic navigational aid device of claim 14, wherein encoded data that have an equal bit length are categorized in a symbol group, and wherein the binary search table includes a base canonical Huffman code for each symbol group and a base symbol index column to provide a base symbol index for each base canonical Huffman code.

21. A navigation system, comprising:
a server; and
a navigation device adapted to communicate with and retrieve navigation data from the server via a communication channel,
wherein the system is adapted to:
perform a $2^N$-deep direct-index lookup using N bits from canonical Huffman encoded navigation data,
extract high-frequency symbol based on the direct-index lookup,
provide bracketing indices for low-frequency data based on the direct-index lookup,
perform a binary search using the bracketing indices to provide a low-frequency symbol index, and
extract the low-frequency symbol associated with the low-frequency symbol index.

22. The navigation system of claim 21, wherein the communication channel includes a wireless channel.

23. The navigation system of claim 21, wherein the server includes a remote server.

24. The navigation system of claim 21, wherein the server includes a processor adapted to respond to a request from the navigation device by performing calculations on the navigation data and transmitting the results to the navigation device.

25. The navigation system of claim 21, wherein the navigation device is adapted to communicate with and retrieve navigation data from the server using streaming data.

26. The navigation system of claim 21, wherein the navigation device is adapted to communicate with and retrieve navigation data from the server using cellular communication technology.

27. The navigation system of claim 21, wherein the navigation device includes a processor in communication with a memory, and wherein the processor and the memory are adapted to cooperate to perform the $2^N$-deep direct-index lookup, to extract the high-frequency symbols, to provide the bracketing indices, to perform the binary search, and to extract the low-frequency symbols.

28. A method, comprising:
performing a direct-index lookup using N bits from canonical Huffman encoded data;
determining whether a high-frequency symbol is found based on the direct-index lookup;

upon determining that a high-frequency symbol is found based on the direct-index lookup, extracting the high-frequency symbol;

upon determining that a high-frequency symbol is not found based on the direct-index lookup, providing bracketing indices for an auxiliary table based on the direct index lookup;

performing a binary search using the auxiliary table and the bracketing indices to provide a low-frequency symbol index; and extracting a low-frequency symbol associated with the low-frequency symbol index.

29. The method of claim 28, further comprising balancing competing needs of decoding speed and memory space by determining a size of an accelerator table and a value N to be used to perform the direct-index lookup for an application design.

30. The method of claim 28, further comprising determining whether to perform another decoding operation; and upon determining to perform another decoding operation, using leftover bits from a current iteration as most significant bits for a successive iteration.

31. The method of claim 28, wherein performing a direct-index lookup using N bits from a canonical Huffman encoded data includes:

retrieving N bits from the canonical Huffman encoded data; and using the N bits to directly index $2^N$-deep into an accelerator table to provide high-frequency symbol indices.

32. The method of claim 28, wherein performing a binary search using the auxiliary table and the bracketing indices to provide a low-frequency symbol index comprises:

retrieving the bracketing indices;

retrieving additional bits from the canonical Huffman encoded data to provide an L-bit compare value;

performing a binary search bounded by the bracketing indices;

identifying a base Huffman code and a base symbol index for the L-bit compare value;

deriving a comparison index from the L-bit compare value and the base Huffman code;

identifying a symbol index from the comparison index and the symbol base index; and extracting a symbol associated with the symbol index.

33. The method of claim 28, further comprising shifting a data string used in a previous decoding iteration to use unused bits in the previous decoding iteration as most significant bits for a successive decoding iteration.

\* \* \* \* \*